US012615845B2

(12) United States Patent
Kang

(10) Patent No.: US 12,615,845 B2
(45) Date of Patent: Apr. 28, 2026

(54) CUTTING DISPLAY PANEL

(71) Applicant: LG Display Co., Ltd., Seoul (KR)

(72) Inventor: Sung Do Kang, Paju-si (RE)

(73) Assignee: LG Display Co., Ltd., Seoul (KR)

( * ) Notice: Subject to any disclaimer, the term of this patent is extended or adjusted under 35 U.S.C. 154(b) by 409 days.

(21) Appl. No.: 18/235,255

(22) Filed: Aug. 17, 2023

(65) Prior Publication Data

US 2024/0204006 A1     Jun. 20, 2024

(30) Foreign Application Priority Data

Dec. 19, 2022     (KR) ......................... 10-2022-0177952

(51) Int. Cl.
*H10D 86/60*          (2025.01)
*G09G 3/3233*          (2016.01)
*H10D 86/40*          (2025.01)

(52) U.S. Cl.
CPC ........... *H10D 86/60* (2025.01); *G09G 3/3233* (2013.01); *H10D 86/441* (2025.01); *G09G 2300/0842* (2013.01)

(58) Field of Classification Search
CPC .................................................... H10K 71/851
See application file for complete search history.

(56) References Cited

U.S. PATENT DOCUMENTS

2023/0154383 A1* 5/2023 Zou ......................... G09G 3/20

FOREIGN PATENT DOCUMENTS

| | | | | | |
|---|---|---|---|---|---|
| CN | 105528987 A | * | 4/2016 | ......... | G02F 1/13306 |
| KR | 10-2016-0042376 | | 4/2016 | | |
| KR | 10-2017-0081109 | | 7/2017 | | |
| KR | 10-2020-0020328 | | 2/2020 | | |

OTHER PUBLICATIONS

Office Action dated Nov. 28, 2025, issued in Korean Patent Application No. 10-2022-0177952.

* cited by examiner

*Primary Examiner* — Evan G Clinton
(74) *Attorney, Agent, or Firm* — PnK IP LLC

(57)          ABSTRACT

Disclosed is a cutting display panel capable of meeting demand for various different resolutions. The cutting display panel includes a plurality of gate lines disposed on a mother substrate in a first direction, a plurality of data lines disposed in a second direction perpendicular to the first direction, a plurality of first block data pads electrically connected to data lines of each of blocks, with X data lines among the plurality of data lines being grouped into each of the blocks, and disposed on one side of each of the plurality of data lines, and a plurality of second block data pads electrically connected to data lines of each of blocks, with Y data lines among the plurality of data lines being grouped into each of the blocks (where X and Y are different natural numbers), and disposed on the opposite side of each of the plurality of data lines.

11 Claims, 6 Drawing Sheets

CUTTING DISPLAY PANEL

CROSS-REFERENCE TO RELATED APPLICATION

This application claims the benefit of Korean Patent Application No. 10-2022-0177952, filed on Dec. 19, 2022, which is hereby incorporated by reference as if fully set forth herein.

BACKGROUND

Field of the Disclosure

The present disclosure relates to a cutting display panel capable of meeting demand for various resolutions through modification of the structure and connection of data pads.

Background

Recently, with the advent of a full-scale information age, displays capable of visually expressing electrical information signals have rapidly developed. Correspondingly, various flat panel display devices having excellent performance, such as slimness, light weight, and low power consumption, have been developed and used.

Representative examples of such flat panel display devices may include a liquid crystal display (LCD), an organic light-emitting display (OLED), an electrophoretic display (EPD), a plasma display panel (PDP), and an electrowetting display (EWD). In particular, an organic light-emitting display is a next-generation display having self-emission characteristics, and has better characteristics than a liquid crystal display in terms of viewing angle, contrast, response speed, and power consumption.

In recent years, a flexible display device, in which a display area and wirings are formed on a flexible substrate made of a flexible material such as plastic, has been attracting attention as a next-generation display device. A flexible display device has been widely applied not only to computer monitors and televisions but also to personal portable devices.

As methods of manufacturing a liquid crystal display panel and an organic light-emitting display panel, there are a cell-based manufacturing method of separately manufacturing individual display panels and a mother-substrate-based display panel manufacturing method of simultaneously manufacturing a plurality of display panels using a mother substrate and then separating the plurality of display panels from each other through a cutting process.

In addition, there is a cutting display panel manufacturing method of manufacturing one display panel on a mother substrate and then cutting the mother substrate in a horizontal direction or a vertical direction to manufacture a display panel having a resolution desired by a customer.

However, in the cutting display panel manufacturing method, when the mother substrate is cut in the vertical direction to realize a resolution demanded by a customer, output terminals of a data driving integrated circuit (IC) may not be connected to data lines of a cut-out display panel, and consequently, driving of the display panel may be impossible.

SUMMARY

Accordingly, the present disclosure is directed to a cutting display panel that substantially obviates one or more problems due to limitations and disadvantages of the related art.

An object of the present disclosure is to provide a cutting display panel capable of meeting demand for various different resolutions through modification of a data pad structure of a mother substrate.

Additional advantages, objects, and features of the disclosure will be set forth in part in the description which follows and in part will become apparent to those having ordinary skill in the art upon examination of the following or may be learned from practice of the disclosure. The objects and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a cutting display panel includes a plurality of gate lines disposed on a mother substrate in a first direction, a plurality of data lines disposed in a second direction, which is perpendicular to the first direction, a plurality of first block data pads electrically connected to data lines of each of blocks, with X data lines among the plurality of data lines being grouped into each of the blocks, and disposed on one side of each of the plurality of data lines, and a plurality of second block data pads electrically connected to data lines of each of blocks, with Y data lines among the plurality of data lines being grouped into each of the blocks (X and Y being different natural numbers), and disposed on the opposite side of each of the plurality of data lines.

The cutting display panel may further include a gate-in-panel (GIP)-type gate driver disposed on both sides or one side of each of the plurality of gate lines on the mother substrate to supply a scan signal to each of the plurality of gate lines.

Each of the plurality of first block data pads and the plurality of second block data pads may be disposed close to the GIP-type gate driver in each block.

The cutting display panel may further include a plurality of first source driver integrated circuits (ICs) disposed on the plurality of first block data pads, and each of the plurality of first source driver ICs may have "X" output channels.

The cutting display panel may further include a plurality of second source driver ICs disposed on the plurality of second block data pads, and each of the plurality of second source driver ICs may have "Y" output channels.

Each of the plurality of first source driver ICs may be a double rate driving (DRD)-type source driver IC.

The cutting display panel may be configured to be cut to include first data pads disposed on the upper side of the plurality of data lines or second data pads disposed on the lower side of the plurality of data lines to manufacture a display panel having a resolution desired by a customer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect (s) of the disclosure and together with the description serve to explain the principle of the disclosure. In the drawings.

DETAILED DESCRIPTION

Figure 1:
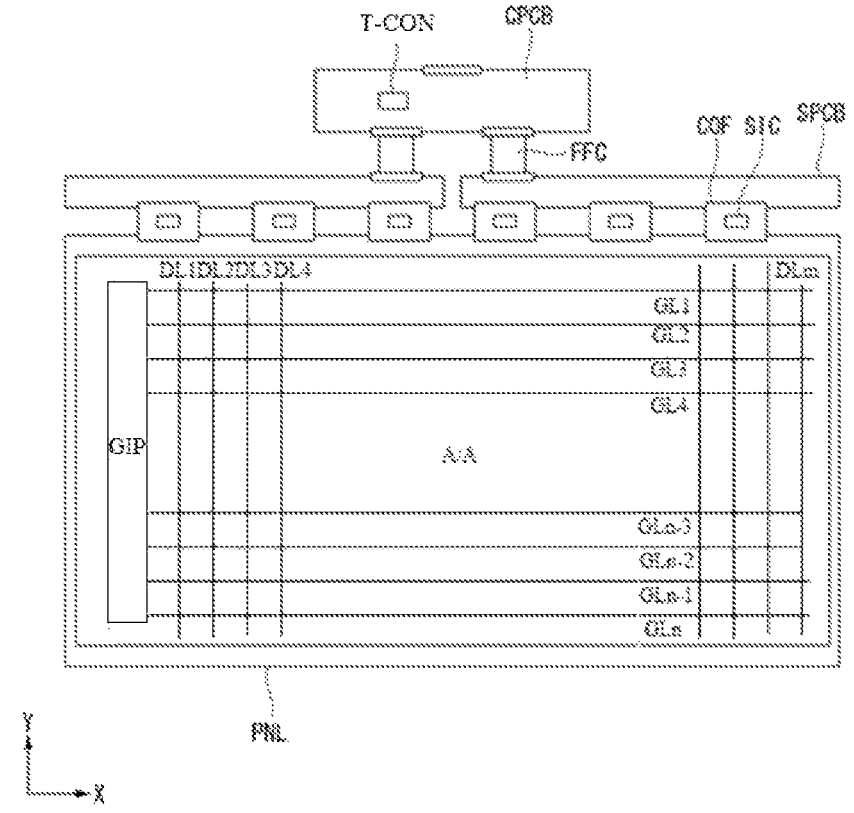
FIG. 1 is a block diagram schematically showing the configuration of a display device according to the present disclosure.

Advantages and features of the present disclosure and methods for achieving them will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art. The present disclosure is defined only by the scope of the claims.

In the drawings for explaining the exemplary embodiments of the present disclosure, for example, the illustrated shape, size, ratio, angle, and number are given by way of example, and thus, are not limited to the disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear.

The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements, the constituent elements are interpreted as including an error range even if there is no explicit description thereof.

In the description of the various embodiments, when describing positional relationships, for example, when the positional relationship between two parts is described using "on", "above", "below", "next to", or the like, one or more other parts may be located between the two parts unless the term "directly" or "closely" is used.

The terms "first", "second", etc. may be used to distinguish various components. However, functions or structures of the components are not limited by names of the components or ordinal numbers prefixed to the component names. Since essential components are mainly stated in the claims, ordinal numbers prefixed to names of the components stated in the claims may not match ordinal numbers prefixed to names of the components described in embodiments of the disclosure.

The features of embodiments of the disclosure may be partially combined or entirely combined with each other, and may be technically interlocking-driven in various ways. The embodiments may be independently implemented, or may be implemented in conjunction with each other.

Hereinafter, various embodiments of the present disclosure will be described in detail with reference to the accompanying drawings.

First, a representative flat panel display device will be described below.

Figure 2:
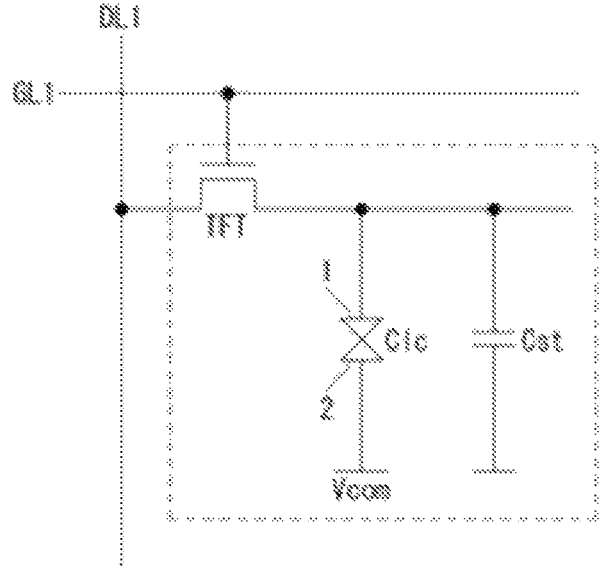
FIG. 2 is a circuit diagram of one sub-pixel in a liquid crystal display panel.
Figure 3:
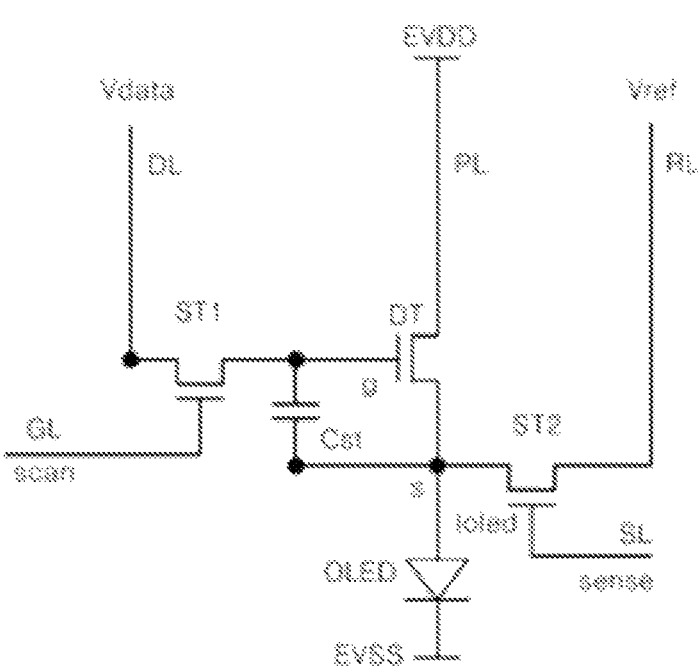
FIG. 3 is a circuit diagram of one sub-pixel in an organic light-emitting diode (OLED) display panel.

FIG. 1 is a block diagram schematically showing the configuration of a display device according to the present disclosure, FIG. 2 is a circuit diagram of one sub-pixel in a liquid crystal display panel, and FIG. 3 is a circuit diagram of one sub-pixel in an organic light-emitting diode (OLED) display panel.

Referring to FIG. 1, a display device according to the present disclosure includes a display panel PNL and a driving circuit configured to supply image data to the display panel PNL.

A display panel PNL may include an active area AA and non-active areas disposed in the vicinity of the active area AA or surrounding the active area AA. The substrate of display panel PNL may include glass, plastic, or a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC) film, polyvinyl alcohol (PVA) film, and polystyrene (PS), and the present disclosure is not limited thereto.

An active area AA of the display panel PNL includes a plurality of data lines DL1 to DLm and a plurality of gate lines GL1 to GLn, which are arranged in an intersecting manner, and a plurality of sub-pixels, which are defined by the plurality of data lines DL1 to DLm and the plurality of gate lines GL1 to GLn and are disposed in a matrix form. Touch sensors may be further disposed in the active area AA of the display panel PNL.

To realize a color image, the plurality of sub-pixels may include red (R), green (G), and blue (B) sub-pixels, and may further include a white (W) sub-pixel in addition to the red (R), green (G), and blue (B) sub-pixels. In addition, the color of sub-pixels is not limited thereto, and may include other color such as cyan, magenta or yellow, etc.

The red (R), green (G), and blue (B) sub-pixels constitute one unit pixel, or the red (R), green (G), blue (B), and white (W) sub-pixels constitute one unit pixel.

The driving circuit includes a data driving circuit, which supplies image data voltages to the data lines DL1 to DLm of the display panel PNL, a gate driving circuit, which supplies scan pulses synchronized with the image data voltages to the gate lines GL1 to GLn of the display panel PNL, and a timing controller T-CON, which controls operation timings of the data driving circuit and the gate driving circuit.

The data driving circuit may include one or more source driver integrated circuits (ICs) SIC. The source driver ICs SIC convert digital video data of an input image into analog gamma compensation voltages under the control of the timing controller T-CON to generate data voltages, and output the data voltages to the data lines DL1 to DLm. The source driver ICs SIC may be mounted on bendable flexible circuit boards, e.g. chip-on-films (COFs), or may be directly adhered to a substrate of a non-active area of the display panel PNL through a COG process.

The COFs are adhered to a pad area of a lower substrate SUBS1 of the display panel PNL and a source PCB SPCB via an anisotropic conductive film (ACF). Input pins of the COFs are electrically connected to output terminals (pads) of the source PCB SPCB. Output pins of the COFs are electrically connected to data pads formed on the substrate of the display panel PNL via an ACF.

The gate driving circuit includes a plurality of stages receiving a start pulse VST, clock signals CRCLK and SCCLK, a gate high voltage VGH, and a gate low voltage VGL from the timing controller T-CON to sequentially output scan pulses to the respective gate lines GL1 to GLn. The plurality of stages sequentially supplies scan pulses synchronized with the data voltages to the respective gate lines GL1 to GLn under the control of the timing controller T-CON to select one line of pixels to which image data voltages are applied.

In an example, the gate driving circuit GIP is disposed in a non-active area on both sides or one side of the active area AA of the display panel PNL through a gate-in-panel (GIP) process. However, the process for forming the gate driving circuit is not limited thereto, for example, the gate driver circuit may be disposed on both sides or one side of the display panel PNL through a TAB process, a COG process or a COP process.

The gate driving circuit GIP includes a plurality of stages that sequentially output scan signals to the respective gate lines GL1 to GLn, and elements (a TFT, a capacitor, etc.) constituting each stage are formed simultaneously with formation of pixel elements in the active area AA.

The thin-film transistor TFT may include any semiconductor layer of various types of semiconductor layers. For example, the semiconductor layer may be formed of one selected from among oxide semiconductor material, amorphous semiconductor material, or polycrystalline semiconductor material, but the present disclosure is not limited thereto.

The oxide semiconductor material may have an excellent effect of preventing a leakage current and relatively inexpensive manufacturing cost. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor may be made of polysilicon, but is not limited thereto.

The amorphous semiconductor material may be made of amorphous silicon (Si), but is not limited thereto The timing controller T-CON is mounted on a control PCB CPCB, and the control PCB CPCB and the source PCB SPCB are connected to each other via a flexible flat cable (FFC).

Here, the display panel PNL may be a liquid crystal display panel, an OLED display panel, or an inorganic LED display panel, but not limited thereto.

When the display panel PNL is a liquid crystal display panel, as shown in FIG. 2, each sub-pixel includes a thin-film transistor (TFT) configured to be controlled in response to a scan signal of a gate line G1 to apply data voltage of a data line D1 to a corresponding pixel electrode and a capacitor Cst configured to maintain the data voltage applied to the pixel electrode during one frame.

When the display panel PNL is an OLED display panel, as shown in FIG. 3, each sub-pixel of the OLED display panel includes an organic light-emitting diode (OLED) and a pixel circuit configured to drive the organic light-emitting diode.

The pixel circuit includes first and second switching TFTs T1 and T2, a storage capacitor Cst, and a driving TFT DT.

The first switching TFT T1, one side of which may connect to a data line DL and another side of which may connect to the gate electrode of the driving TFT DT, charges the storage capacitor Cst with data voltage DATA of a data line in response to a scan pulse Scan of a gate line. The driving TFT DT controls the amount of current supplied to the organic light-emitting diode (OLED) based on the data voltage charged in the storage capacitor Cst to adjust the amount of light emitted from the organic light-emitting diode (OLED). The second switching TFT T2, one side of which may connect to anode of the organic light-emitting diode (OLED) and another side of which may connect to a reference line RL, senses the threshold voltage and mobility of the driving TFT DT in response to a sensing signal Sense of sensing line SL.

The organic light-emitting diode (OLED) may include a first electrode (e.g. an anode or a cathode), an organic emission layer, and a second electrode (e.g. a cathode or an anode).

The storage capacitor Cst is electrically connected between a gate electrode (gate) and a source electrode (source) of the driving TFT DT to maintain data voltage corresponding to image signal voltage or voltage equivalent thereto during the time period of one frame.

Although the sub-pixel is illustrated in FIG. 3 as having a 3T1C structure, which includes three TFTs T1, T2, and DT and one storage capacitor Cst, the disclosure is not limited thereto and various configurations of internal compensation circuits are possible. For example, a number of TFTs in the pixel circuit of each sub-pixel of the present disclosure may be three or more, and a number of storage capacitor may be one or more, for example, the pixel circuit of each sub-pixel of the present disclosure also may be a 3T2C pixel circuit including three TFTs and two storage capacitors, a 4T1C pixel circuit including four TFTs and one storage capacitor, a 4T2C pixel circuit including four TFTs and two storage capacitors, a 5T1C pixel circuit including five TFTs and one storage capacitor, a 5T2C pixel circuit including five TFTs and two storage capacitors, a 7T2C pixel circuit including seven TFTs and two storage capacitors, or the like.

Meanwhile, respective subpixels of the plurality of sub-pixels may have the same structure, or some subpixels of the plurality of subpixels may have a different structure. Each of the driving TFT and switching TFTs may be an N-type transistor or a P-type transistor. In the case of an N-type transistor, the gate-on voltage may be a gate-high voltage, and the gate-off voltage may be a gate-low voltage. In the case of a P-type transistor, the gate-on voltage may be the gate-low voltage and the gate-off voltage may be the gate-high voltage.

The display panel PNL described above may be manufactured through a cutting display panel manufacturing method.

A cutting display panel manufacturing method will be described below.

Figure 4:
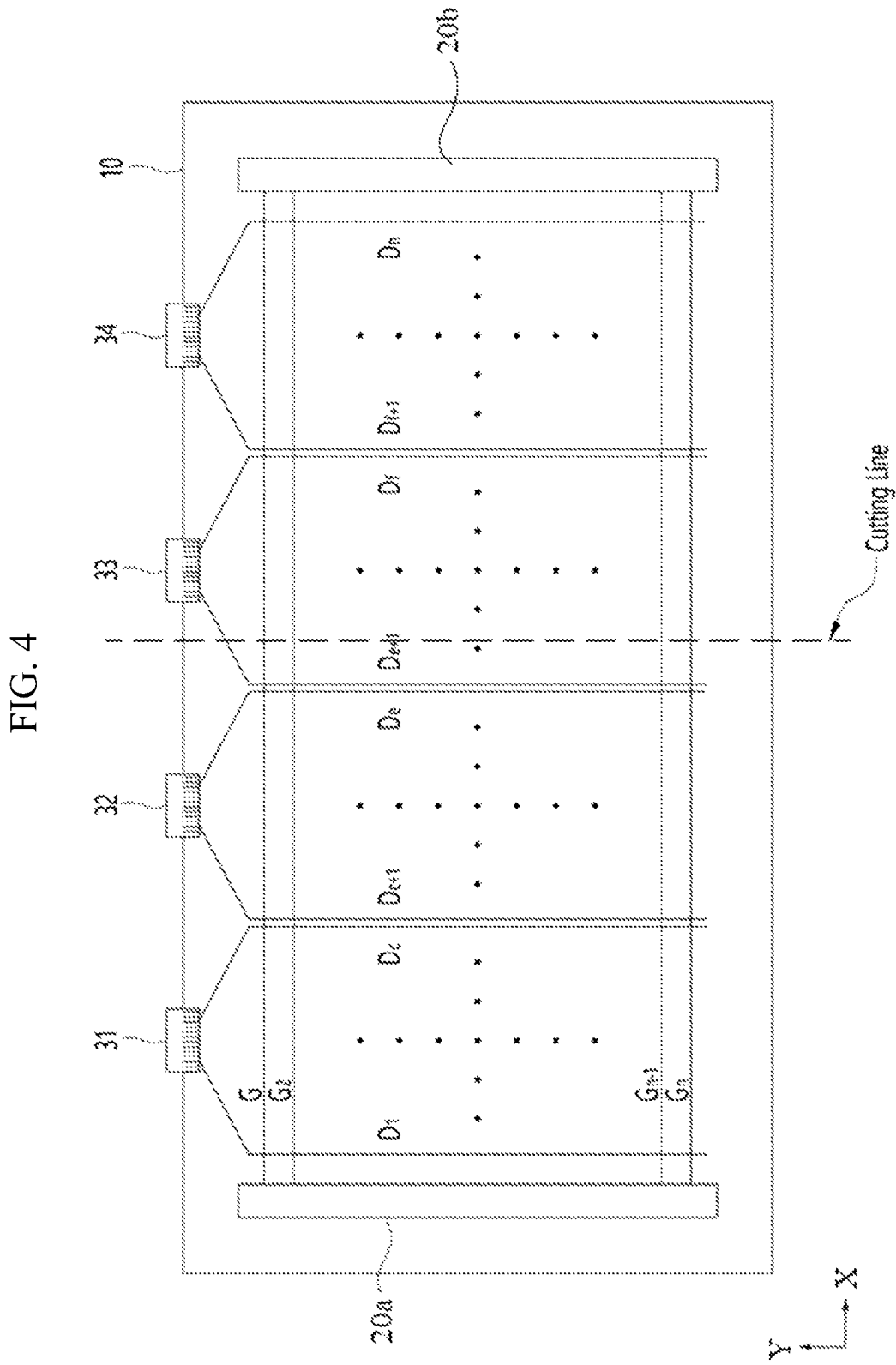
FIG. 4 is a view for explaining a cutting display panel according to a first aspect of the present disclosure.

FIG. 4 is a view for explaining a cutting display panel according to a first aspect of the present disclosure.

On a mother substrate 10, a plurality of gate lines G1 to Gn is disposed in a first direction, and a plurality of data lines D1 to Dc, Dc+1 to De, De+1 to Df, and Df+1 to Dm is disposed in a second direction, which is a direction perpendicular to the first direction. A plurality of sub-pixels is disposed in a matrix form in a region in which the plurality of gate lines G1 to Gn and the plurality of data lines D1 to Dc, Dc+1 to De, De+1 to Df, and Df+1 to Dm intersect each other.

When the display panel is a liquid crystal display panel, the plurality of gate lines G1 to Gn and the plurality of data lines D1 to Dc, Dc+1 to De, De+1 to Df, and Df+1 to Dm are disposed to intersect each other on a thin-film transistor array substrate, which is similar to the above-mentioned mother substrate. In addition, as shown in FIG. 2, a thin-film transistor (TFT) and a pixel electrode are disposed in each pixel area.

In addition, a black matrix, a color filter, and a common electrode are disposed on a color filter array substrate. The thin-film transistor array substrate and the color filter array substrate are bonded to each other, with a predetermined space defined therebetween, and a liquid crystal layer is disposed between the thin-film transistor array substrate and the color filter array substrate.

When the display panel is an OLED display panel, as shown in FIG. 3, an organic light-emitting diode (OLED) and a pixel circuit configured to independently drive the organic light-emitting diode are disposed in each pixel area.

The pixel circuit may include first and second switching TFTs T1 and T2, a storage capacitor Cst, and a driving TFT DT.

In addition, gate-in-panel (GIP)-type first and second gate drivers 20*a* and 20*b* configured to supply scan signals to the respective gate lines are disposed on both sides of the plurality of gate lines G1 to Gn.

Data pads are disposed beside the plurality of data lines D1 to Dc, Dc+1 to De, De+1 to Df, and Df+1 to Dm.

A plurality of source driver ICs 31 to 34 configured to supply data voltages to the respective data lines is disposed on the data pads.

The source driver ICs 31 to 34 may be mounted on bendable flexible circuit boards through chip-on-films (COFs) process, may be connected to the display panel PNL through a tape-automated bonding (TAB) process, and adhered to the data pads, or may be directly adhered to a substrate of a non-active area of the mother substrate 10 through a chip-on-glass (COG) or a chip-on-panel (COP) process. However, the process for forming the source driver ICs 31 to 34 is not limited thereto.

FIG. 4 illustrates a structure in which the source driver ICs 31 to 34 are directly adhered to a substrate of a non-active area of the mother substrate 10.

Each of the source driver ICs 31 to 34 has a plurality of output channels, and is electrically connected to data lines, the number of which corresponds to the number of output channels.

For example, assuming that each of the source driver ICs 31 to 34 has 720 output channels, 720 data lines are grouped into each block, and each of the source driver ICs 31 to 34 is disposed on a respective block of the data lines.

The cutting display panel configured as described above is cut in a horizontal direction or a vertical direction in response to a resolution demanded by a customer, thereby manufacturing the display panel PNL shown in FIG. 1.

In some cases, however, when the cutting technology is applied, the output channels of the data driver may not be connected to the data lines. Therefore, some resolutions may not be realized through the cutting technology.

For example, when the display panel PNL is cut along the cutting line indicated in FIG. 4 in response to a demanded resolution, the output channels of the source driver ICs 31 to 34 may not be connected to data lines from the data line De+1 to the data line closest to the cutting line.

Therefore, a cutting display panel capable of meeting demand for various resolutions is required.

Figure 5:
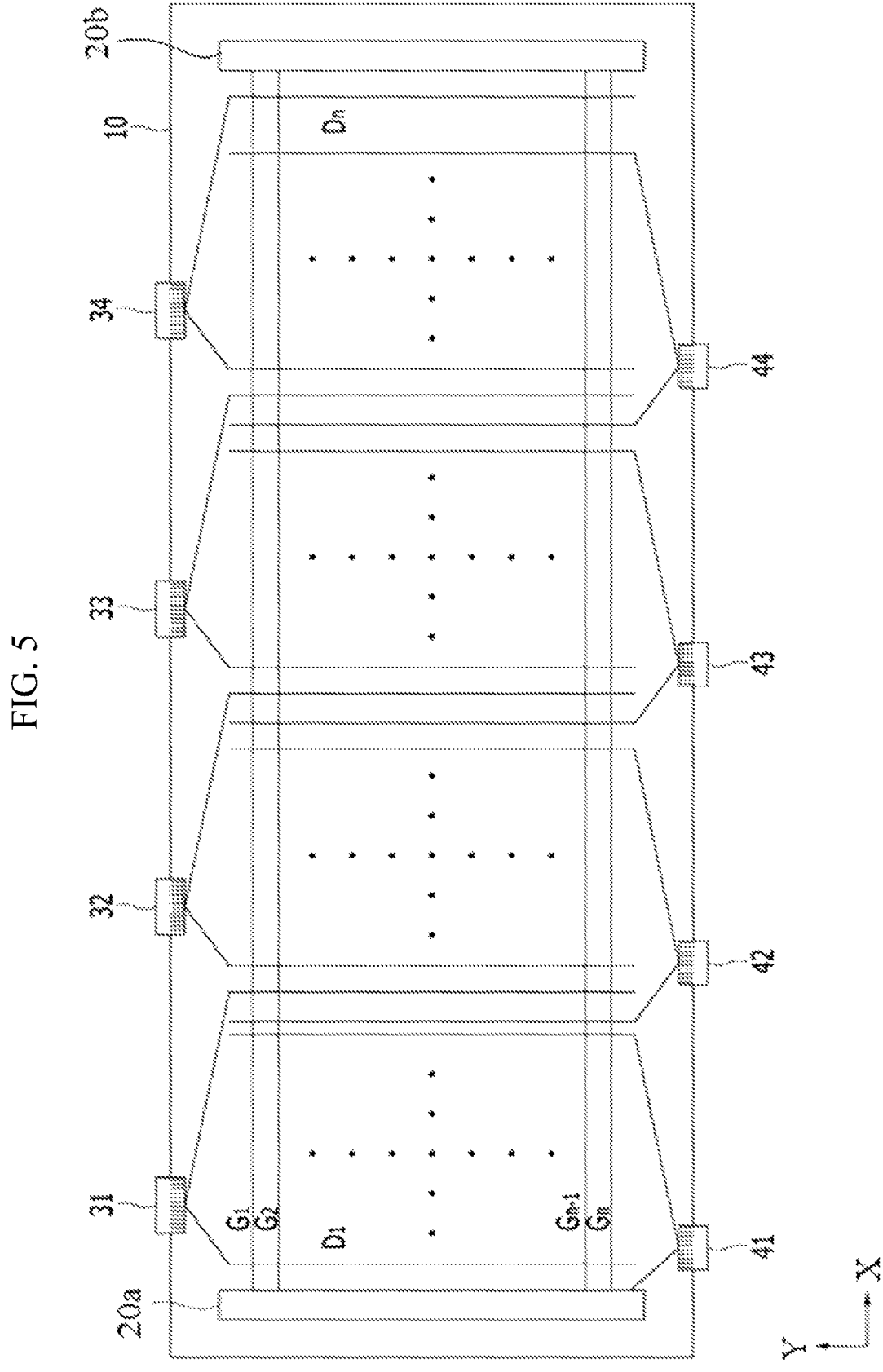
FIG. 5 is a view for explaining a cutting display panel according to a second aspect of the present disclosure.

FIG. 5 is a view for explaining a cutting display panel according to a second aspect of the present disclosure.

On a mother substrate 10, a plurality of gate lines G1 to Gn is disposed in a first direction, and a plurality of data lines D1 to Dm is disposed in a second direction, which is a direction perpendicular to the first direction. A plurality of sub-pixels is disposed in a matrix form in a region in which the plurality of gate lines G1 to Gn and the plurality of data lines D1 to Dm intersect each other.

When the display panel is a liquid crystal display panel, the plurality of gate lines G1 to Gn and the plurality of data lines D1 to Dm are disposed to intersect each other on a thin-film transistor array substrate, which is similar to the above-mentioned mother substrate. In addition, as shown in FIG. 2, a thin-film transistor (TFT) and a pixel electrode are disposed in each pixel area.

When the display panel is an OLED display panel, as shown in FIG. 3, an organic light-emitting diode (OLED) and a pixel circuit configured to independently drive the organic light-emitting diode are disposed in each pixel area.

The pixel circuit may include first and second switching TFTs T1 and T2, a storage capacitor Cst, and a driving TFT DT.

In addition, gate-in-panel (GIP)-type first and second gate drivers 20*a* and 20*b* configured to supply scan signals to the respective gate lines are disposed on both sides of the plurality of gate lines G1 to Gn.

A plurality of first data pads are disposed on an upper side of the plurality of data lines D1 to Dm, and each of the plurality of first data pads electrically connected to one end of each of the plurality of data lines D1 to Dm. A plurality of second data pads are disposed on a lower side of the plurality of data lines D1 to Dm, and each of the plurality of second data pads electrically connected to the other end of each of the plurality of data lines D1 to Dm.

A plurality of first source driver ICs 31 to 34 are configured to supply data voltages to the respective data lines D1 to Dm and electrically connected to the first data pads. A plurality of second source driver ICs 41 to 44 are configured to supply data voltages to the respective data lines D1 to Dm and electrically connected to the second data pads.

The plurality of first and second source driver ICs 31 to 34 and 41 to 44 may be mounted on bendable flexible circuit boards through chip-on-films (COFs) process, and adhered to the data pads, may be connected to the display panel PNL through a tape-automated bonding (TAB) process, or may be directly adhered to a substrate of a non-active area of the mother substrate 10 through a chip-on-glass (COG) or a chip-on-panel (COP) process. However, the process for forming the plurality of first and second source driver ICs 31 to 34 and 41 to 44 is not limited thereto.

The plurality of first source driver ICs 31 to 34 and the plurality of second source driver ICs 41 to 44 have different numbers of output channels from each other, and are electrically connected to the data lines, the number of which corresponds to the number of output channels.

For convenience of explanation, it is assumed that each of the plurality of first source driver ICs 31 to 34 has 720 output channels and each of the plurality of second source driver ICs 41 to 44 has 576 output channels.

Therefore, a plurality of blocks, each of which is composed of 720 data lines, is formed, and separate the first data pads are disposed on each block on the upper side of the plurality of data lines D1 to Dm.

In addition, a plurality of blocks, each of which is composed of 576 data lines, is formed, and separate the second data pads are disposed on each block on the lower side of the plurality of data lines D1 to Dm.

AS shown in FIG. 5, The first and second data pads disposed on each of the blocks on the upper and lower sides of the plurality of data lines D1 to Dm are disposed on one side portion of each block, rather than being disposed on a center portion of each block.

It is preferable that the first and second data pads disposed on each block be disposed on the left portion or the right portion of each block. Although the first and second data pads disposed on each block are illustrated in FIG. 5 as being located on the left portion of each block, the disclosure is not limited thereto, for example, the first and second data pads may be located on the right portion of each block.

Considering the case in which a display panel manufactured through cutting of the mother substrate is to use the first gate driver 20a, it is preferable that the first and second data pads disposed on each of the data line blocks adjacent to the first gate driver 20a be located on a side portion of each block that is close to the first gate driver 20a (for example, a left portion of each block).

On the other hand, considering the case in which a display panel manufactured through cutting of the mother substrate is to use the second gate driver 20b, it is preferable that the first and second data pads disposed on each of the data line blocks adjacent to the second gate driver 20b be located on a side portion of each block that is close to the second gate driver 20b (for example, a right portion of each block).

The specific reason for this will be described in detail based on the cutting method.

The cutting display panel configured as described above is cut in a horizontal direction or a vertical direction in response to a resolution demanded by a customer, thereby manufacturing the display panel PNL shown in FIG. 1.

Hereinafter, a method of cutting the cutting display panel will be described.

Figure 6:
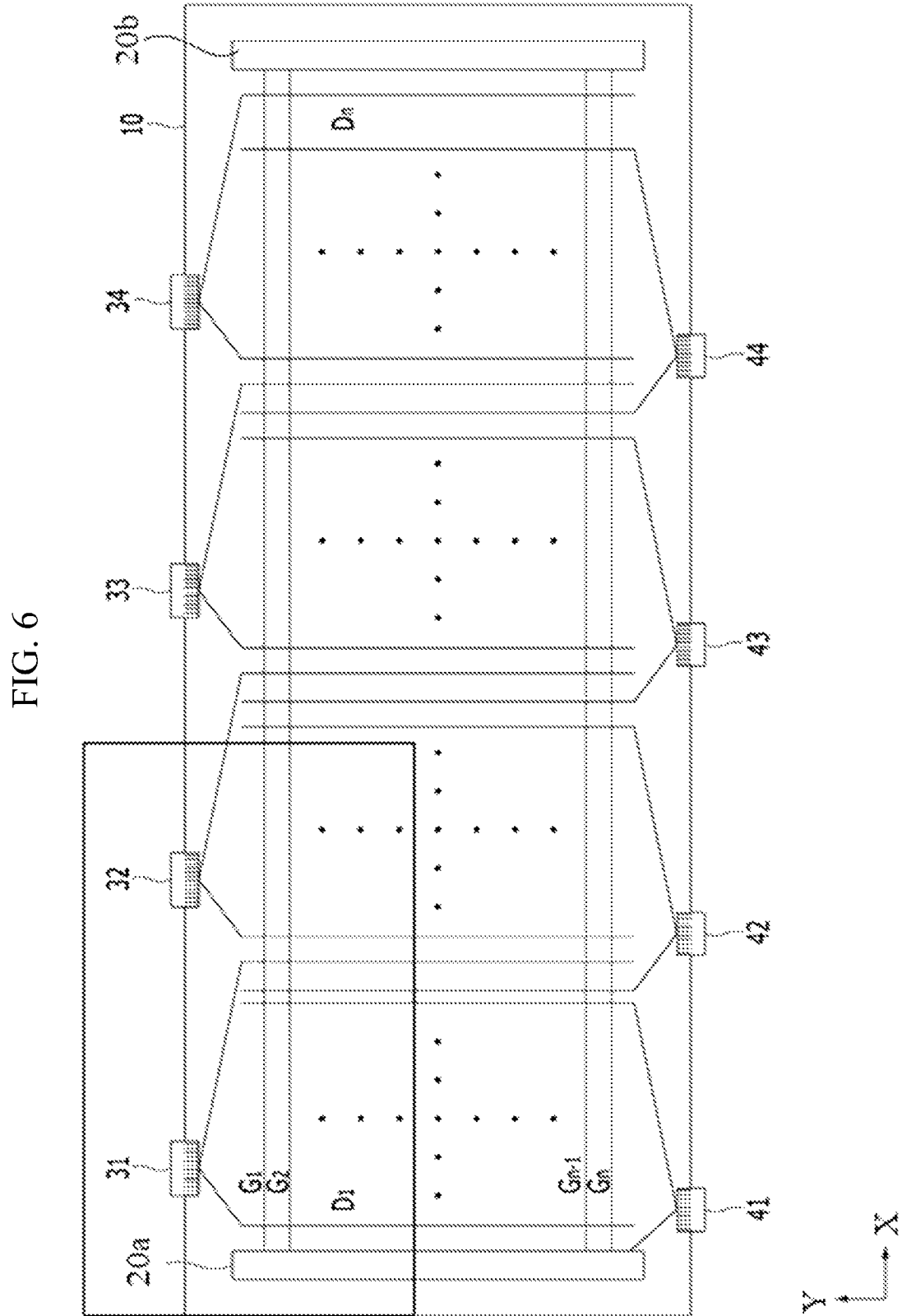
FIG. 6 is a view for explaining a method of cutting the cutting display panel according to the first aspect of the present disclosure to manufacture a display panel having a resolution of 800*540.

FIG. 6 is a view for explaining a method of cutting the cutting display panel according to the first aspect of the present disclosure to manufacture a display panel having a resolution of 800*540.

In the display panel, the resolution of 800*540 means that the horizontal resolution is 800. In the case in which a unit pixel is composed of three sub-pixels, which are red (R), green (G), and blue (B) sub-pixels, the resolution of 800*540 means that an image is displayed by 2400 (=800*3) data lines.

To manufacture a display panel having a resolution of 800*540 using the first data pads disposed on the upper side of the plurality of data lines D1 to Dm, four blocks of first data pads (2880 (=720*4) data lines) are required.

On the other hand, to manufacture a display panel having a resolution of 800*540 using the second data pads disposed on the lower side of the plurality of data lines D1 to Dm, five blocks of second data pads (2880 (=576*5) data lines) are required.

Therefore, in the case in which the source driver IC supplies data voltage to one sub-pixel in the vertical direction through one data line, to manufacture a display panel having a resolution of 800*540, the first data pads disposed on the upper side of the plurality of data lines D1 to Dm may be used, or the second data pads disposed on the lower side of the plurality of data lines D1 to Dm may be used.

However, since the source driver IC is very expensive compared to other elements, a double rate driving (DRD) method has recently been proposed to reduce the number of source driver ICs and consequently to lower a cost of manufacturing a display device.

In the DRD method, the number of source driver ICs required is halved, but the resolution is maintained by doubling the number of gate lines and halving the number of data lines.

That is, a DRD-type source driver IC supplies data voltage to two sub-pixels in the vertical direction through one data line.

Here, the plurality of first source driver ICs 31 to 34 and the plurality of second source driver ICs 41 to 44 mounted on the first and second data pads disposed on the upper and lower sides of the plurality of data lines D1 to Dm may be DRD-type source driver ICs.

As such, when the plurality of first source driver ICs 31 to 34 and the plurality of second source driver ICs 41 to 44 are DRD-type source driver ICs, to manufacture a display panel having a resolution of 800*540 using the first data pads disposed on the upper side of the plurality of data lines D1 to Dm, two blocks of first data pads (1440 (=720*2) data lines) are required, and to manufacture a display panel having a resolution of 800*540 using the second data pads disposed on the lower side of the plurality of data lines D1 to Dm, three blocks of second data pads (1728 (=576*3) data lines) are required.

Therefore, when the plurality of first source driver ICs 31 to 34 and the plurality of second source driver ICs 41 to 44 are DRD-type source driver ICs and when a display panel having a resolution of 800*540 is manufactured, it is more efficient to use the first data pads disposed on the upper side of the plurality of data lines D1 to Dm.

FIG. 6 illustrates a process of cutting the cutting display panel in the horizontal and vertical directions to manufacture a display panel having a resolution of 800*540 using the first data pads disposed on the upper side of the plurality of data lines D1 to Dm.

Figure 7:
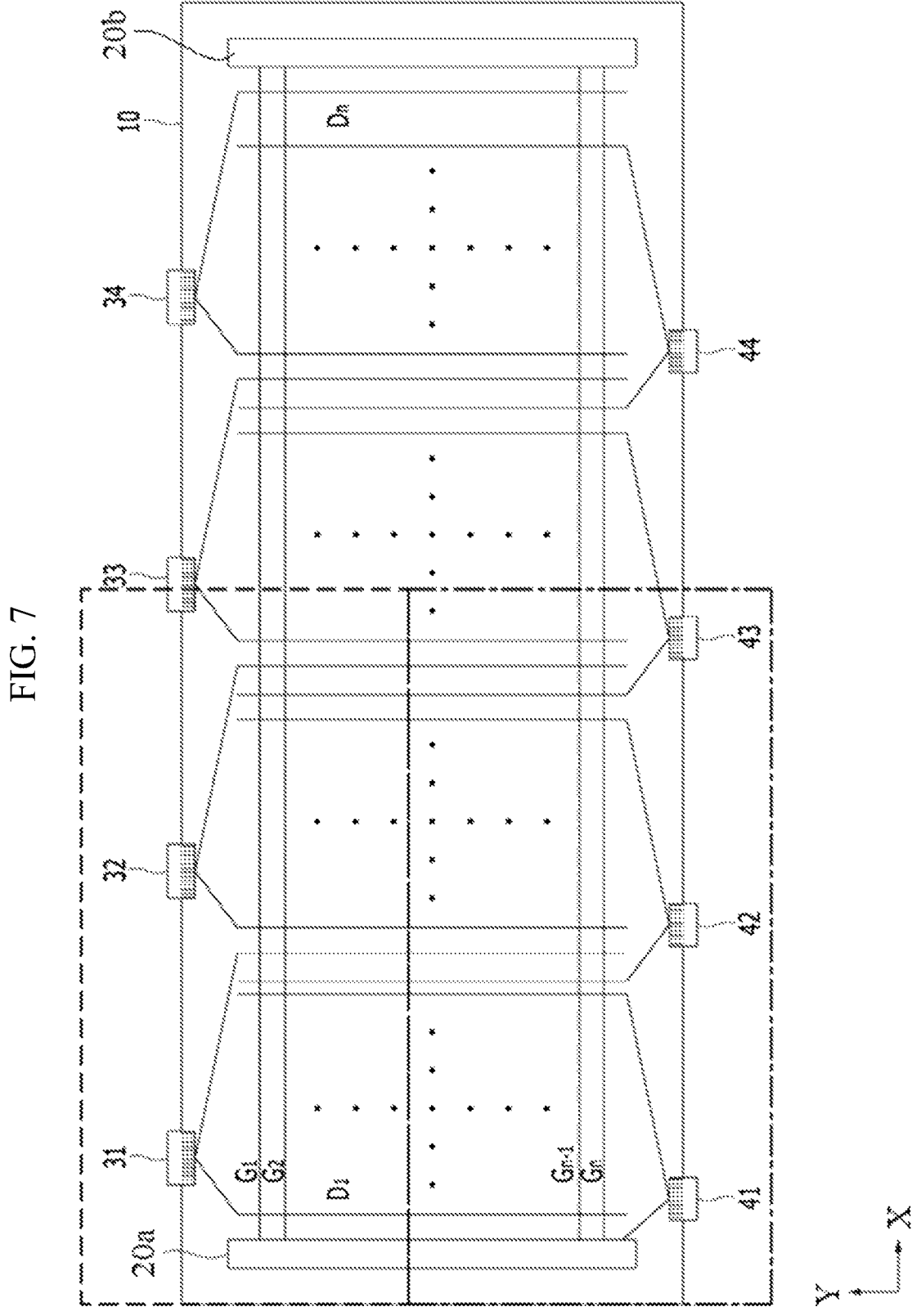
FIG. 7 is a view for explaining a method of cutting the cutting display panel according to the second aspect of the present disclosure to manufacture a display panel having a resolution of 1000*540.

FIG. 7 is a view for explaining a method of cutting the cutting display panel according to the second aspect of the present disclosure to manufacture a display panel having a resolution of 1000*540.

In the display panel, the resolution of 1000*540 means that the horizontal resolution is 1000. In the case in which a unit pixel is composed of three sub-pixels, which are red (R), green (G), and blue (B) sub-pixels, the resolution of 1000*540 means that an image is displayed by 3000 (=1000*3) data lines.

To manufacture a display panel having a resolution of 1000*540 using the first data pads disposed on the upper side of the plurality of data lines D1 to Dm, five blocks of data pads (3600 (=720*5) data lines) are required.

On the other hand, to manufacture a display panel having a resolution of 1000*540 using the second data pads disposed on the lower side of the plurality of data lines D1 to Dm, six blocks of data pads (3456 (=576*6) data lines) are required.

Therefore, when a display panel having a resolution of 1000*540 is manufactured, it is more efficient to use the second data pads disposed on the lower side of the plurality of data lines D1 to Dm.

When the plurality of first source driver ICs 31 to 34 and the plurality of second source driver ICs 41 to 44 mounted on the first and second data pads disposed on the upper and lower sides of the plurality of data lines D1 to Dm are DRD-type source driver ICs, to manufacture a display panel having a resolution of 1000*540 using the first data pads disposed on the upper side of the plurality of data lines D1 to Dm, three blocks of data pads (2160 (=720*3) data lines) are required, and to manufacture a display panel having a resolution of 1000*540 using the second data pads disposed on the lower side of the plurality of data lines D1 to Dm, three blocks of data pads (1728 (=576*3) data lines) are required.

However, when the plurality of first source driver ICs 31 to 34 is a DRD-type source driver IC, if a portion near the $1500^{th}$ data line is cut to manufacture a display panel having a resolution of 1000*540 using the first data pads disposed on the upper side of the plurality of data lines D1 to Dm, the first data pad area disposed on the upper side of the plurality of data lines D1 to Dm is cut. Therefore, it is not possible to use the first data pads disposed on the upper side of the plurality of data lines D1 to Dm to manufacture a display panel having a resolution of 1000*540.

Therefore, when the plurality of first source driver ICs 31 to 34 and the plurality of second source driver ICs 41 to 44 are DRD-type source driver ICs and when a display panel having a resolution of 1000*540 is manufactured, it is more efficient to use the second data pads disposed on the lower side of the plurality of data lines D1 to Dm.

FIG. 7 illustrates a process of cutting the cutting display panel in the horizontal and vertical directions to manufacture a display panel having a resolution of 1000*540 using the data pads disposed on the lower side of the plurality of data lines D1 to Dm.

As described above, to manufacture a display panel having a resolution desired by a customer by cutting the cutting display panel, it is preferable that the data pads of each block be located on a left portion or a right portion of each block. That is, it is preferable that the data pads of each block be located on a side portion of each block that is close to one of the first and second gate drivers 20a and 20b.

As described above, since the first data pads disposed on the upper side of the plurality of data lines D1 to Dm or the second data pads disposed on the lower side of the plurality of data lines D1 to Dm may be selectively used depending on a driving scheme of the source driver ICs and a resolution desired by a customer, it is possible to manufacture a display panel having any of various resolutions by cutting the cutting display panel according to the present disclosure.

As is apparent from the above description, the cutting display panel according to the present disclosure having the above characteristics has the following effects.

According to the present disclosure, a plurality of first block data pads is disposed on one side of each of a plurality of data lines, with "X" data lines among the plurality of data lines being grouped into each block, and a plurality of second block data pads is disposed on the opposite side of each of the plurality of data lines, with "Y" data lines among the plurality of data lines being grouped into each block (where "X" and "Y" are different natural numbers).

Therefore, first data pads disposed on the upper side of the plurality of data lines D1 to Dm or second data pads disposed on the lower side of the plurality of data lines D1 to Dm may be selectively used depending on a driving scheme of source driver ICs and a resolution desired by a customer, and consequently, a display panel having any of various resolutions may be manufactured.

Those skilled in the art will understand that various modification and alternations are possible from the above description without departing from the technical idea of the present disclosure. Consequently, the technical scope of the present disclosure is defined by the appended claims, not by the detailed description of the present disclosure.

What is claimed is:

1. A cutting display panel comprising:
   a plurality of gate lines disposed on a mother substrate in a first direction;
   a plurality of data lines disposed in a second direction, the second direction being a direction perpendicular to the first direction;
   a plurality of first block data pads electrically connected to data lines of each of blocks, with X data lines among the plurality of data lines being grouped into each of the blocks, and disposed on one side of each of the plurality of data lines; and
   a plurality of second block data pads electrically connected to data lines of each of blocks, with Y data lines among the plurality of data lines being grouped into each of the blocks (X and Y being different natural numbers), and disposed on an opposite side of each of the plurality of data lines.

2. The cutting display panel according to claim 1, further comprising:
   a gate-in-panel (GIP)-type gate driver disposed on both sides or one side of each of the plurality of gate lines on the mother substrate to supply a scan signal to each of the plurality of gate lines.

3. The cutting display panel according to claim 2, wherein each of the plurality of first block data pads and the plurality of second block data pads is disposed close to the GIP-type gate driver in each block.

4. The cutting display panel according to claim 2, wherein each of the plurality of first block data pads and the plurality of second block data pads is disposed on the left portion or the right portion in each block.

5. The cutting display panel according to claim 1, further comprising:
   a plurality of first source driver integrated circuits (ICs) disposed on the plurality of first block data pads, each of the plurality of first source driver ICs having X output channels.

6. The cutting display panel according to claim 5, wherein each of the plurality of first source driver ICs is a double rate driving (DRD)-type source driver IC.

7. The cutting display panel according to claim 1, further comprising:
   a plurality of second source driver ICs disposed on the plurality of second block data pads, each of the plurality of second source driver ICs having Y output channels.

8. The cutting display panel according to claim 7, wherein each of the plurality of second source driver ICs is a DRD-type source driver IC.

9. The cutting display panel according to claim 1, wherein the cutting display panel is configured to be cut so as to comprise first data pads disposed on an upper side of the plurality of data lines or second data pads disposed on a lower side of the plurality of data lines to manufacture a display panel having a resolution desired by a customer.

10. The cutting display panel according to claim 1, further comprising:

a plurality of first source driver integrated circuits (ICs) disposed on the plurality of first block data pads; and a plurality of second source driver ICs disposed on the plurality of second block data pads, wherein, the plurality of first source driver ICs and the plurality of second source driver ICs have different numbers of output channels from each other.

11. The cutting display panel according to claim 10, wherein each of the plurality of first source driver ICs and the plurality of second source driver ICs are electrically connected to the data lines, and a number of output channels of the plurality of first source driver ICs corresponds to a number of data lines to which the plurality of first source driver ICs connect and a number of output channels of the plurality of second source driver ICs corresponds to a number of data lines to which the plurality of second source driver ICs connect.

* * * * *